US 11,495,546 B2

(12) United States Patent
Park et al.

(10) Patent No.: US 11,495,546 B2
(45) Date of Patent: Nov. 8, 2022

(54) SUBSTRATE HAVING ELECTRONIC COMPONENT EMBEDDED THEREIN

(71) Applicant: SAMSUNG ELECTRO-MECHANICS CO., LTD., Suwon-si (KR)

(72) Inventors: Je Sang Park, Suwon-si (KR); Chang Yul Oh, Suwon-si (KR); Sang Ho Jeong, Suwon-si (KR); Yong Duk Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 68 days.

(21) Appl. No.: 16/801,906

(22) Filed: Feb. 26, 2020

(65) Prior Publication Data

US 2021/0175159 A1    Jun. 10, 2021

(30) Foreign Application Priority Data

Dec. 10, 2019    (KR) .......................... 10-2019-0163280

(51) Int. Cl.
*H01L 23/538*    (2006.01)
*H01L 21/48*    (2006.01)
(Continued)

(52) U.S. Cl.
CPC ........ *H01L 23/5386* (2013.01); *H01L 21/486* (2013.01); *H01L 21/4857* (2013.01);
(Continued)

(58) Field of Classification Search
CPC ........... H01L 23/5383; H01L 23/49822; H01L 23/5384; H01L 23/49827; H01L 23/5386; H01L 23/49838; H01L 23/5389; H01L 23/13; H01L 21/4857; H01L 21/486; H01L 25/0657; H01L 25/0652;
(Continued)

(56) References Cited

U.S. PATENT DOCUMENTS 10,163,798 B1 *  12/2018  Alur ................... H01L 21/4857
2008/0230892 A1 *  9/2008  Chang ................... H05K 1/183
257/E23.024
(Continued)

FOREIGN PATENT DOCUMENTS

JP    2012-146983 A    8/2012
KR    10-2019-0064370 A    6/2019

*Primary Examiner* — Yu Chen
(74) *Attorney, Agent, or Firm* — Morgan, Lewis & Bockius LLP (57) ABSTRACT

A substrate having an electronic component embedded therein includes a core substrate including first and second wiring layers disposed on different levels and one or more insulating layers disposed between the first and second wiring layers, having a cavity in which a stopper layer is disposed on a bottom surface of the cavity, and including a groove disposed around the stopper layer on the bottom surface; an electronic component disposed on the stopper layer in the cavity; an insulating material covering at least a portion of each of the core substrate and the electronic component and disposed in at least a portion of each of the cavity and the groove; and a third wiring layer disposed on the insulating material. The stopper layer protrudes on the bottom surface.

20 Claims, 7 Drawing Sheets

(51) Int. Cl.
*H01L 23/13* (2006.01)
*H01L 25/065* (2006.01)
*H01L 23/00* (2006.01)

(52) U.S. Cl.
CPC .......... *H01L 23/13* (2013.01); *H01L 23/5383* (2013.01); *H01L 23/5384* (2013.01); *H01L 23/5389* (2013.01); *H01L 24/32* (2013.01); *H01L 25/0657* (2013.01); *H01L 2224/32237* (2013.01)

(58) Field of Classification Search
CPC . H01L 2224/32238; H01L 2224/32235; H01L 2224/32237; H01L 2924/15153–15157; H05K 3/4697; H05K 3/0026–0038; H05K 1/183; H05K 1/185–188
See application file for complete search history.

(56) References Cited

U.S. PATENT DOCUMENTS

| | | | |
|---|---|---|---|
| 2012/0181074 A1* | 7/2012 | Ishihara | H05K 3/4697 174/261 |
| 2013/0020120 A1* | 1/2013 | Ishihara | H05K 3/4697 174/262 |
| 2013/0299223 A1* | 11/2013 | Yoo | H05K 1/02 174/259 |
| 2016/0037640 A1* | 2/2016 | Takai | H01L 23/49827 361/753 |
| 2016/0322294 A1* | 11/2016 | Kobayashi | H01L 23/49822 |
| 2017/0271266 A1* | 9/2017 | Kim | H01L 24/97 |
| 2019/0164895 A1 | 5/2019 | Kim et al. | |

* cited by examiner

SUBSTRATE HAVING ELECTRONIC COMPONENT EMBEDDED THEREIN

CROSS-REFERENCE TO RELATED APPLICATION(S)

This application claims benefit of priority to Korean Patent Application No. 10-2019-0163280 filed on Dec. 10, 2019 in the Korean Intellectual Property Office, the disclosure of which is incorporated herein by reference in its entirety.

BACKGROUND

The present disclosure relates to a substrate having an electronic component embedded therein.

With the arrival of 5th generation (5G) era, the number of components mounted on a mainboard of a smartphone has increased. It may also be necessary to secure a space in which components such as an antenna for 5G communications, a baseband modem, and the like, are mounted while maintaining compatibility with 4G communications, LTE communications. Accordingly, reduction of a size of a component by modulating the component in a form of a system-in-package (SiP) has been considered.

SUMMARY

An aspect of the present disclosure is to provide a substrate having an electronic component embedded therein which may improve productivity of a cavity process for mounting an electronic component.

Another aspect of the present disclosure is to provide a substrate having an electronic component embedded therein which may be modulated in a form of a SiP and may have a reduced size.

Another aspect of the present disclosure is to provide a structure in which a cavity process for mounting an electronic component using a laser process may be performed.

Another aspect of the present disclosure is to provide a modulated structure by mounting a component on a substrate having an electronic component embedded therein.

According to an aspect of the present disclosure, a substrate having an electronic component embedded therein includes a core substrate including first and second wiring layers disposed on different levels and one or more insulating layers disposed between the first and second wiring layers, having a cavity in which a stopper layer is disposed on a bottom surface of the cavity, and including a groove disposed around the stopper layer on the bottom surface; an electronic component disposed on the stopper layer in the cavity; an insulating material covering at least a portion of each of the core substrate and the electronic component and disposed in at least a portion of each of the cavity and the groove; and a third wiring layer disposed on the insulating material. The stopper layer protrudes on the bottom surface.

According to an aspect of the present disclosure, a substrate having an electronic component embedded therein includes a core substrate including a first insulating layer, a second insulating layer disposed on an upper surface of the first insulating layer, a first wiring layer disposed on a lower surface of the first insulating layer, and a second wiring layer disposed on an upper surface of the second insulating layer, having a cavity penetrating the second insulating layer and having an upper surface of the first insulating layer as a bottom surface of the cavity and a groove penetrating a portion of the first insulating layer disposed around the bottom surface, and having a stopper layer disposed on the bottom surface; an electronic component disposed on the stopper layer in the cavity; an insulating material laminated on the core substrate and the electronic component; and a third wiring layer disposed on the insulting material, wherein the stopper layer is disposed between the first and second wiring layers.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings. In the drawings, shapes, sizes, and the like, of elements may be exaggerated or briefly illustrated for clarity of description.

Figure 1:
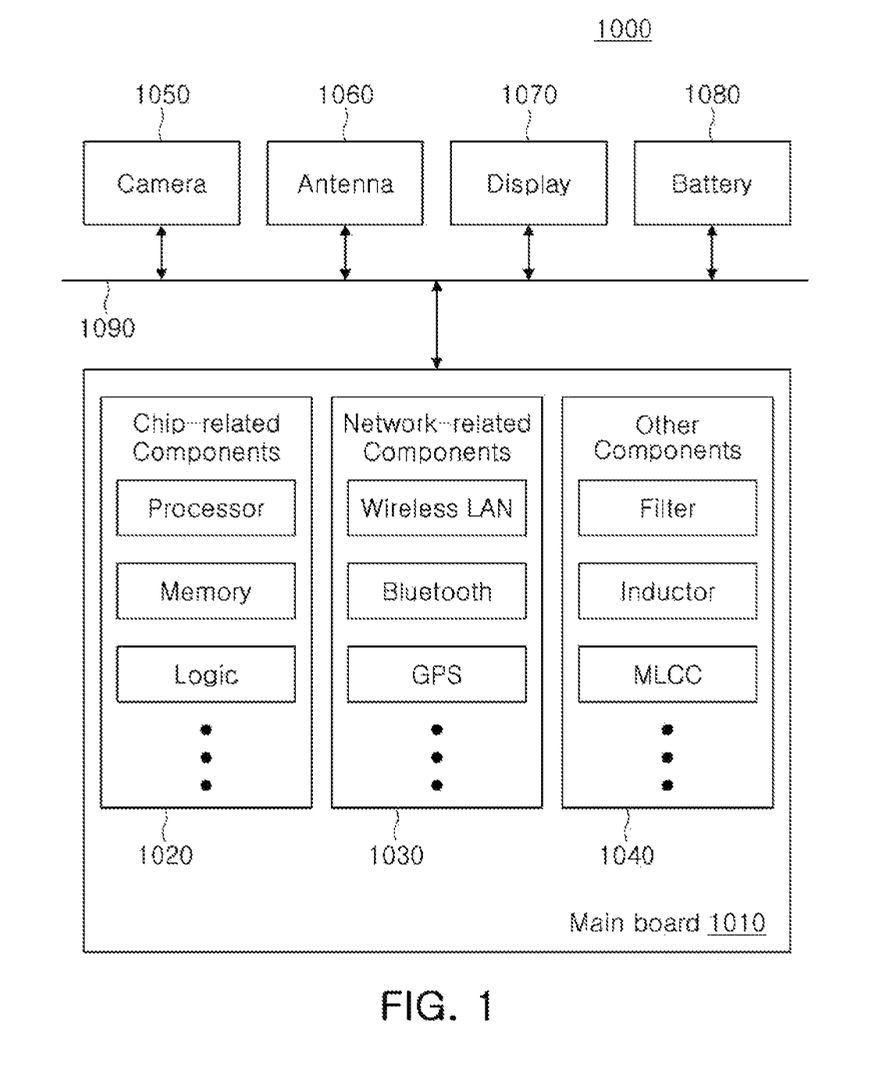
FIG. 1 is a block diagram illustrating an example of an electronic device system.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
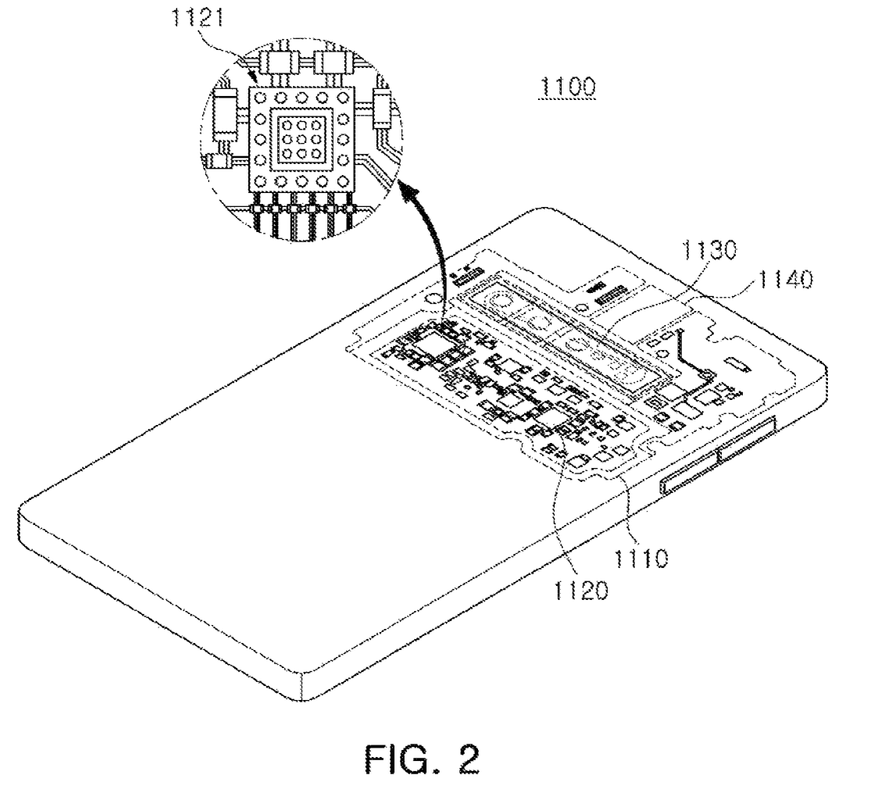
FIG. 2 is a perspective diagram illustrating an example of an electronic device.

FIG. 2 is a perspective diagram illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, a semiconductor package 1121, for example, but are not limited thereto. The electronic device is not necessarily limited to the smartphone 1100, but may be other electronic devices as described above.

Figure 3:
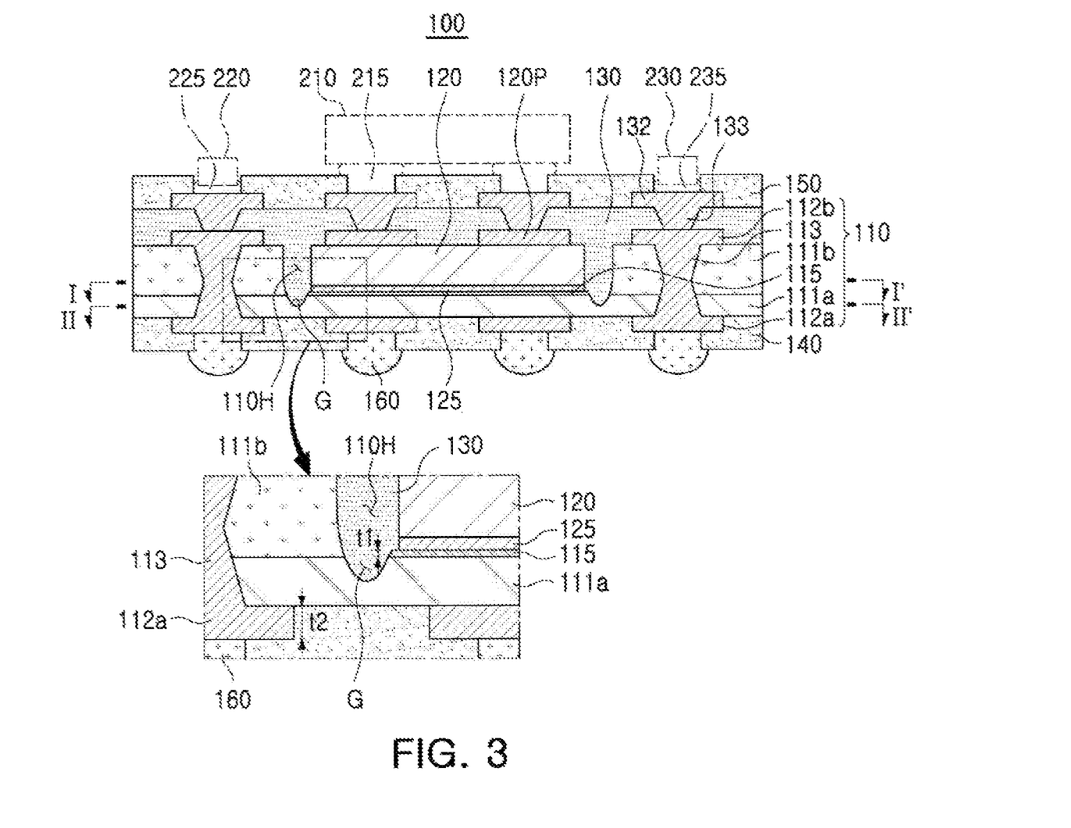
FIG. 3 is a cross-sectional diagram illustrating an example of a substrate having an electronic component embedded therein.

FIG. 3 is a cross-sectional diagram illustrating a substrate having an electronic component embedded therein.

Figure 4:
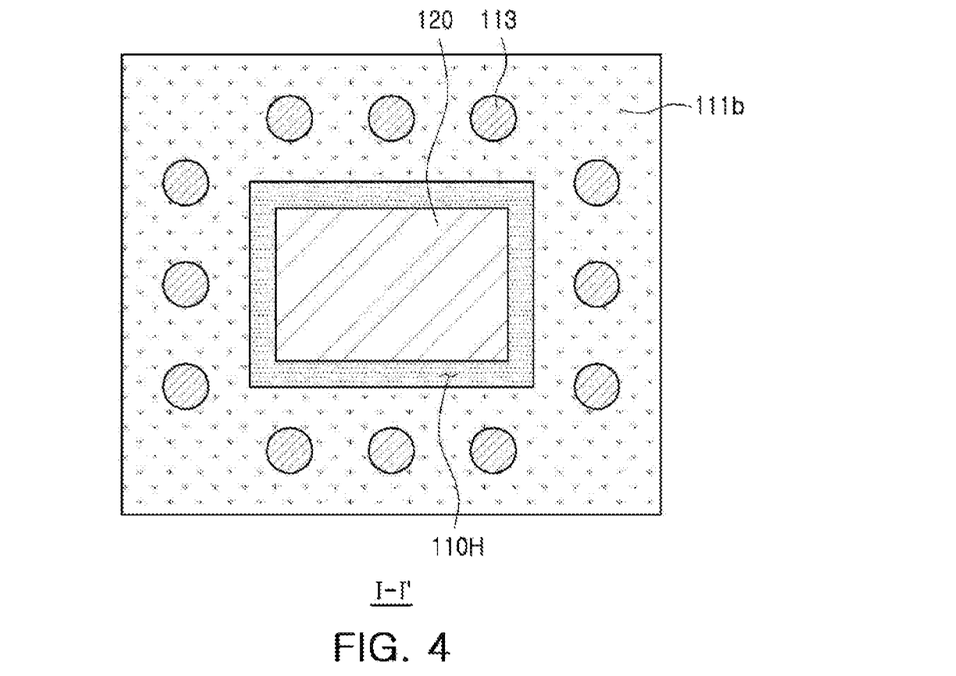
FIG. 4 is a cross-sectional plan diagram illustrating a substrate having an electronic component embedded therein illustrated in FIG. 3 taken long line I-I' in FIG. 3.

FIG. 4 is a cross-sectional plan diagram illustrating a substrate having an electronic component embedded therein illustrated in FIG. 3 taken long line I-I' in FIG. 3.

Figure 5:
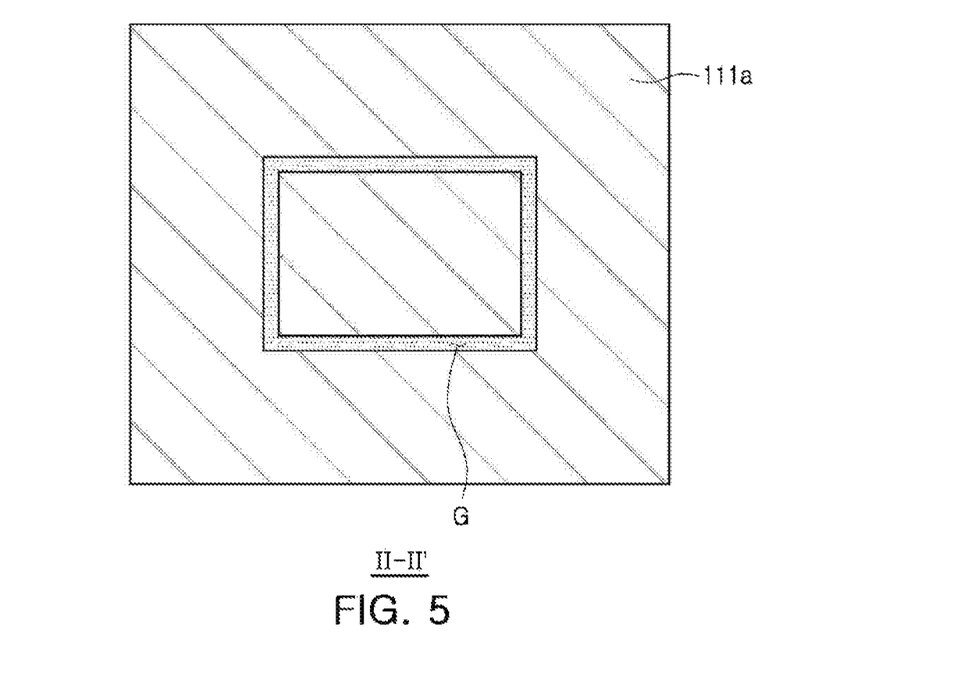
FIG. 5 is a cross-sectional plan diagram illustrating a substrate having an electronic component embedded therein illustrated in FIG. 3 taken long line II-II' in FIG. 3.

FIG. 5 is a cross-sectional plan diagram illustrating a substrate having an electronic component embedded therein illustrated in FIG. 3 taken long line II-II' in FIG. 3.

Referring to the diagrams, a substrate having an electronic component embedded therein 100 may include a core substrate 110 including first and second wiring layers 112a and 112b disposed on different levels and first and second insulating layers 111a and 111b disposed between the first and second wiring layers 112a and 112b, having a cavity 110H in which a stopper layer 115 is disposed on a bottom surface of the cavity 110H, and including a groove G formed around the stopper layer 115 on the bottom surface, an electronic component 120 disposed on the stopper layer 115 in the cavity 110H of the core substrate 110, an insulating material 130 covering at least a portion of each of the core substrate 110 and the electronic component 120 and filling at least a portion of each of the cavity 110H and the groove G, a third wiring layer 132 disposed on the insulating material 130, a first passivation layer 140 disposed on a lower side of the core substrate 110, a second passivation layer 150 disposed on an upper side of the insulating material 130, and an electrical connector metal 160 disposed on a first opening of the first passivation layer 140.

In an example embodiment, the stopper layer 115 may protrude on a bottom surface of the cavity 110H. For example, the cavity 110H may penetrate through the second insulating layer 111b from an upper surface of the second insulating layer 111b towards a lower surface of the second insulating layer 111b such that an upper surface of the first insulating layer 111a may be provided to a bottom surface of the cavity 110H. Accordingly, the stopper layer 115 may protrude on the first insulating layer 111a in the cavity 110H. The groove G may penetrate a portion of the first insulating layer 111a from an upper surface of the first insulating layer 111a towards a bottom surface of the first insulating layer 111a, and may surround the stopper layer 115.

As described above, with the arrival of 5th generation (5G) era, the number of components mounted on a mainboard of a smartphone has increased. It may also be necessary to secure a space in which components such as an antenna for 5G communications, a baseband modem, and the like, are mounted while maintaining compatibility with 4G communications, LTE communications. Accordingly, reduction of a size of a component has been considered, by modulating the component in a form of a system-in-package (SiP). As for a structure for modulation to SiP, a method of mounting a passive device on a substrate in which an IC is embedded and manufacturing a component as a single module may be considered, for example. As for a structure for embedding an IC in a substrate, a structure in which a four-layer core substrate is manufactured, a non-through cavity is formed on one of the four layers, an IC is embedded, and an insulating layer and a circuit layer are formed only in an upper portion, for example, may be considered.

As for processing such a non-through cavity, a blast method of physically etching a substrate by spraying high pressure particles on the surface of the substrate while only a certain region of a surface of the substrate is exposed using a mask, a method of forming a cavity using a laser, or the like, may be used. A blast method may be advantageous in terms of productivity of processing a substrate panel having a relatively large size, but a deviation in cavity size on a panel may increase, and there may be a cost for a mask. A laser method may have high accuracy in relation to a size of a cavity, but when a cavity area is processed using a laser, a relatively great amount of time may be consumed, which may degrade productivity.

Figure 6:
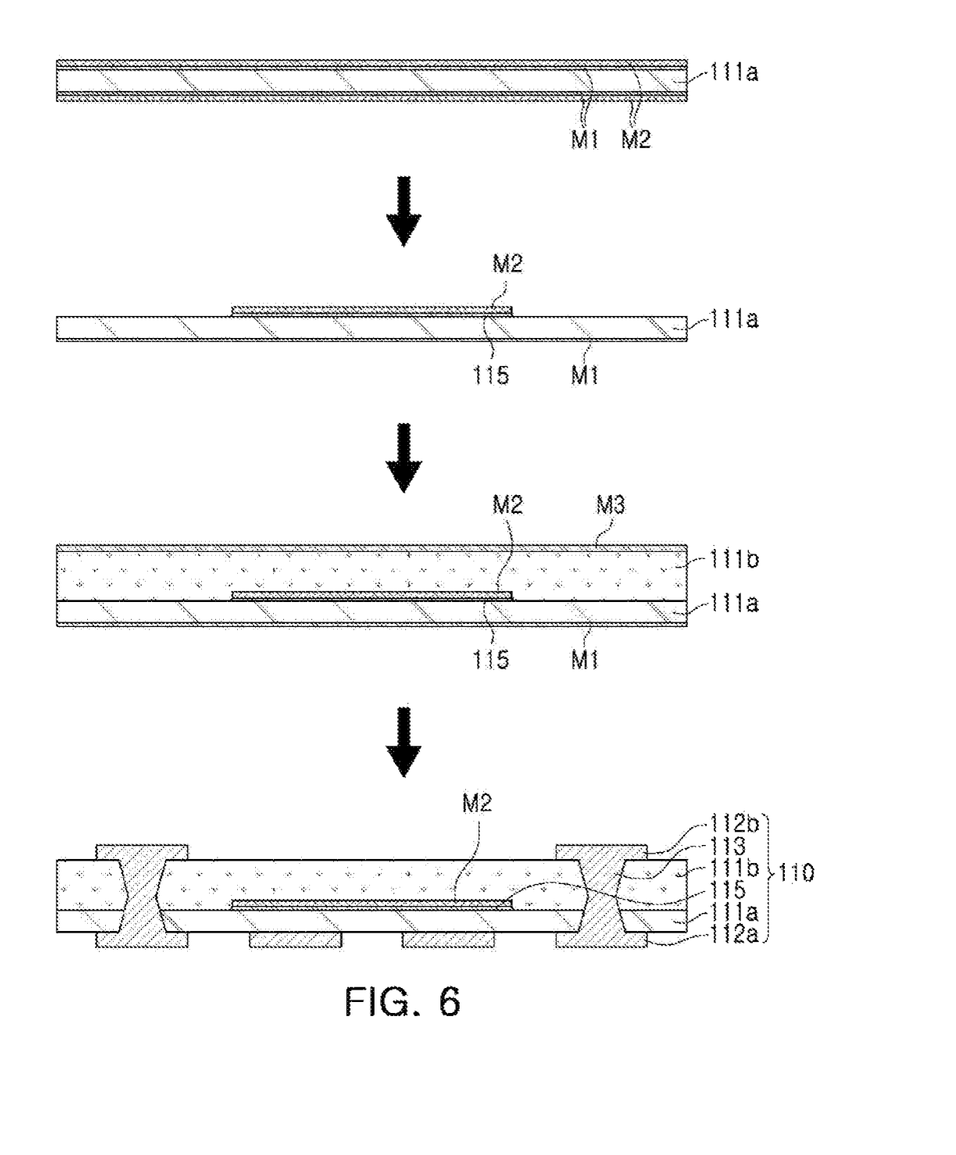
FIGS. 6 to 8 are diagrams illustrating an example of a process for manufacturing a substrate having an electronic component embedded therein illustrated in FIG. 3.
Figure 7:
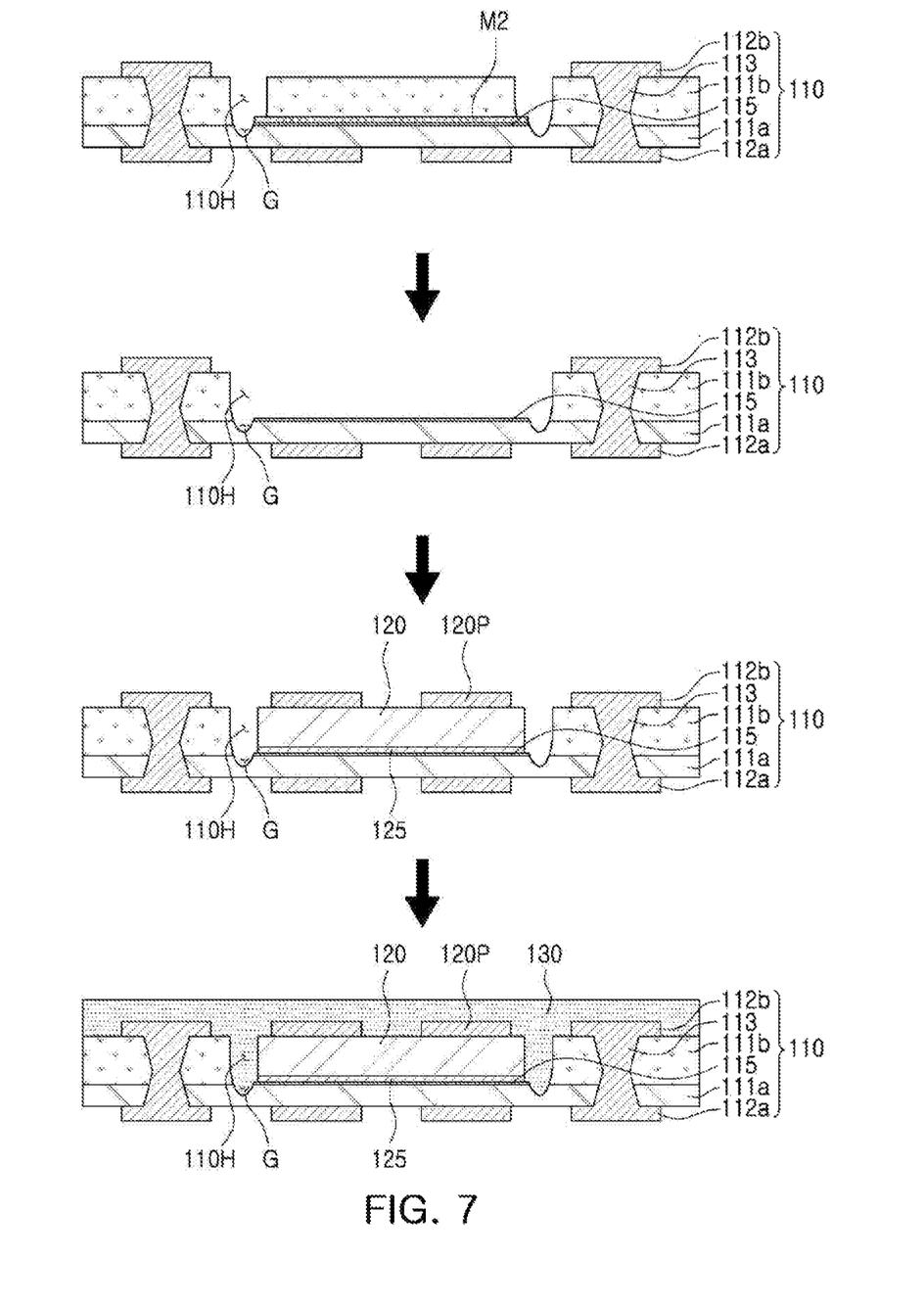
Figure 8:
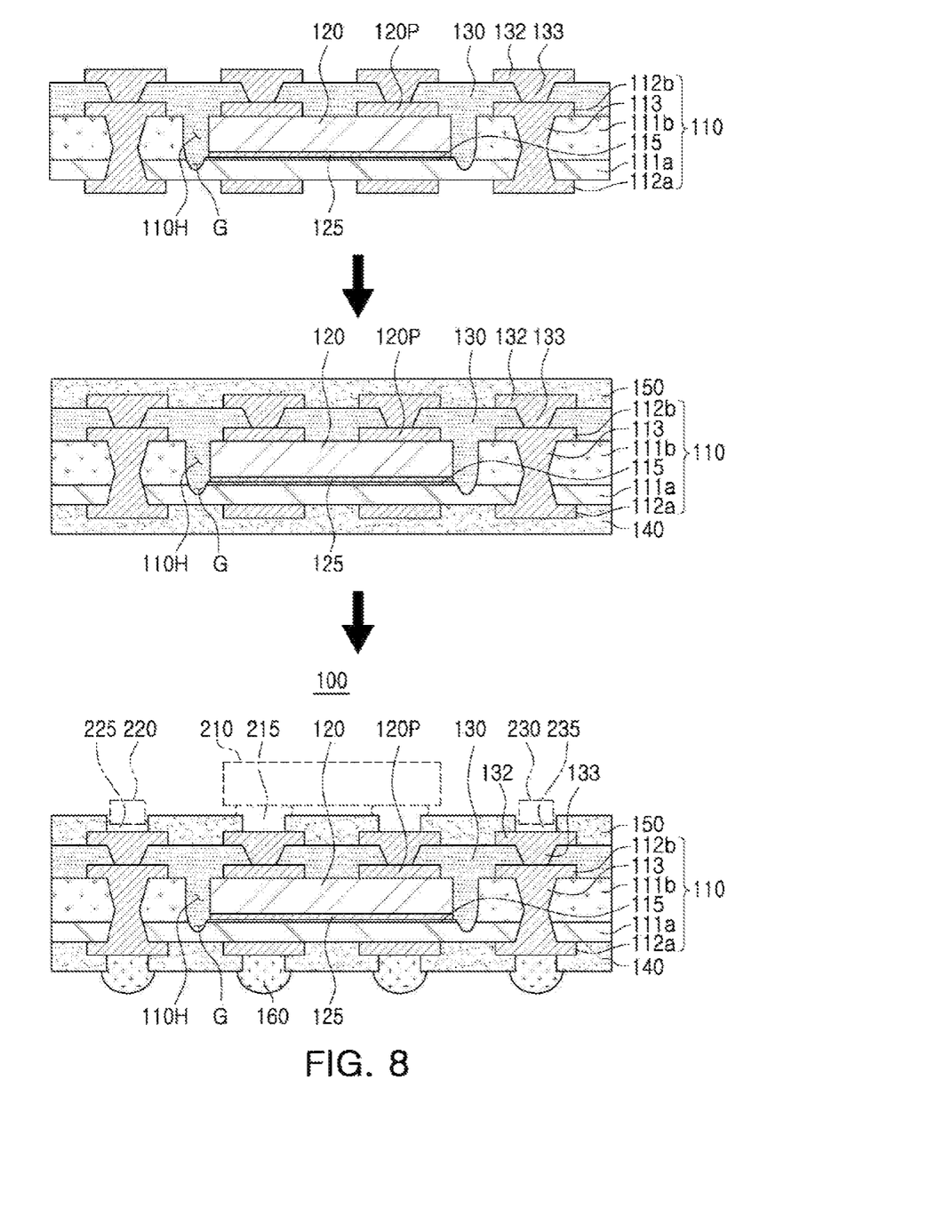

As for the structure of the substrate having an electronic component embedded therein 100 in the example embodiment, a laser process may be used for forming a non-through cavity and productivity may also improve. For example, as illustrated in FIGS. 6 to 8, in the example embodiment, a carrier copper foil M2 of the stopper layer 115 may be used as a stopper for a laser process for forming the cavity 110H without removing the carrier copper foil M2, and a laser process may be repeatedly performed to only along an edge of the stopper. In this case, a portion of a laser beam may be blocked by a stopper, and the other portion of a laser beam may process the first and second insulating layers 111a and 111b. When the processing of the edge is used, a process time may be significantly reduced even for a laser process. Further, by controlling a profile of a wall of the cavity 110H, a foot may be reduced. The carrier copper foil M2 and the second insulating layer 111b remaining on the carrier copper foil M2 may be easily removed through a release layer peeling process. In a structural sense, the groove G extending from the cavity 110H and penetrating a portion of the first insulating layer 111a may further be formed around the stopper layer 115 protruding on an upper surface of the first insulating layer 111a, a bottom surface of the cavity 110H. The groove G may be configured to consecutively surround the stopper layer 115 in a form of a furrow.

In the description below, the elements included in the substrate having an electronic component embedded therein 100 will be described in greater detail in accordance with an example embodiment with reference to the drawings.

The core substrate 110 may improve stiffness of the substrate having an electronic component embedded therein 100 depending on a specific material, and may secure uniformity of a thickness of the insulating material 130, and the like. Also, as the core substrate 110 includes the first and second wiring layers 112a and 112b and a through-via 113, various circuits may be designed, and upper and lower electrical connection paths may be provided. Further, as the core substrate 110 includes the second wiring layer 112b disposed on a level lower than an inactive surface, a backside wiring layer may easily be provided.

The core substrate 110 may have the cavity 110H in which the stopper layer 115 is disposed on a bottom surface of the second insulating layer 111b, and may further include the groove G extending from the cavity 110H and formed around the stopper layer 115. The cavity 110H may be configured to penetrate through the second insulating layer 111b from an upper surface of the second insulating layer 111b towards a lower surface of the second insulating layer 111b, and the groove G may be configured to penetrate only a portion of the first insulating layer 111a from an upper surface of the first insulating layer 111a towards a lower surface of the first insulating layer 111a. The groove G may penetrate a portion of the first insulating layer 111a to consecutively surround the stopper layer 115 in a form of a furrow. The cavity 110H may have first and second walls having first and second slopes, respectively. The first wall may be disposed almost perpendicularly with respect to the upper or lower surface of the second insulating layer 111b. The first wall may have a certain acute angle with respect to the upper or lower surface of the second insulating layer 111b. Accordingly, the first slope may be less than the second slope with respect to the upper or lower surface of the second insulating layer 111b. The groove G may extend from the first wall of the cavity 110H and may have a rounded shape extending from the first wall of the cavity 110H.

As a material of the first insulating layer 111a, an insulating material may be used. As an insulating material, an insulating material of a copper clad laminate (CCL) may be used. However, the material is not limited thereto, and a thermosetting resin such as an epoxy resin, a thermoplastic resin such as a polyimide resin, an insulating material in which the thermosetting resin or the thermoplastic resin is impregnated in a core material with an inorganic filler and/or a glass fiber (or a glass cloth or a glass fabric), such as prepreg, Ajinomoto build-up film (ABF), FR-4, bismaleimide triazine (BT), or the like, for example, may be used. When a material having high stiffness, such as prepreg including glass fiber, warpage may be effectively controlled.

The second insulating layer 111b may be disposed on the first insulating layer 111a. As a material of the second insulating layer 111b, an insulating material may be used, and as the insulating material, an insulating material of a resin coated copper may be used. However, an example embodiment thereof is not limited thereto, and ABF, FR-4, BT, or the like, mentioned above, may be used. A thickness of the second wiring layer 112b may be greater than a thickness of the first insulating layer 111a, but an example embodiment thereof is not limited thereto. If desired, the thickness of the first insulating layer 111a may be greater than the thickness of the second wiring layer 112b.

The second wiring layer 112b may be disposed on an upper surface of the second insulating layer 111b. The second wiring layer 112b may include a metal material such as copper (Cu), aluminum (Al), silver (Ag), tin (Sn), gold (Au), nickel (Ni), lead (Pb), titanium (Ti), or alloys thereof. The second wiring layer 112b may perform various functions in example embodiments. For example, the second wiring layer 112b may include a ground (GND) pattern, a power (PWR) pattern, a signal (S) pattern, and the like. The signal (S) pattern may include various signals other than a ground (GND) pattern, a power (PWR) pattern, and the like, a data signal, and the like, for example. Each pattern may have a line shape, a plane shape, or a pad shape. The second wiring layer 112b may be formed through a process such as an additive process (AP), a semi-AP (SAP) process, a modified SAP (MSAP) process, a tenting (TT) process, or the like, and accordingly, the second wiring layer 112b may include a seed layer, which is an electroless plating layer, and an electrolytic plating layer formed based on the seed layer.

The first wiring layer 112a may be disposed on a lower surface of the first insulating layer 111a. The first wiring layer 112a may also include a metal material such as copper (Cu), aluminum (Al), silver (Ag), tin (Sn), gold (Au), nickel (Ni), lead (Pb), titanium (Ti), or alloys thereof. The first wiring layer 112a may perform various functions in example embodiment. For example, the first wiring layer 112a may include a ground (GND) pattern, a power (PWR) pattern, a signal (S) pattern, and the like. The signal (S) pattern may include various signals other than a ground (GND) pattern, a power (PWR) pattern, and the like, a data signal, and the like, for example. Each pattern may have a line shape, a plane shape, or a pad shape. The first wiring layer 112a may be formed through a process such as an AP, a SAP, a MSAP, a TT, or the like, and accordingly, the first wiring layer 112a may include a seed layer, which is an electroless plating layer, and an electrolytic plating layer formed based on the seed layer.

The through-via 113 may penetrate the first and second insulating layers 111a and 111b, and may connect the first and second wiring layers 112a and 112b to each other. The first and second wiring layers 112a and 112b may be electrically connected to each other through the through-via 113. The through-via 113 may be integrated with each of the first and second wiring layers 112a and 112b without boundaries. The through-via 113 may include a metal material such as copper (Cu), aluminum (Al), silver (Ag), tin (Sn), gold (Au), nickel (Ni), lead (Pb), titanium (Ti), or alloys thereof. The through-via 113 may include a via used for a signal, a via used for ground, a via used for power, and the like. The through-via 113 may be completely filled with a metal material, or a metal material may be formed along a wall of a via hole. The through-via 113 may have various shapes such as an hour-glass shape, a cylindrical shape, and the like. The through-via 113 may also be formed by an AP, a SAP, a MSAP, a TT, or the like, and accordingly, the through-via 113 may include a seed layer, which is an electroless plating layer, and an electrolytic plating layer formed based on the seed layer.

The stopper layer 115 may be disposed on an upper surface of the first insulating layer 111a. The stopper layer 115 may be disposed on a level between the first and second wiring layers 112a and 112b disposed on different levels. The stopper layer 115 may be configured as a copper foil of a CCL, and may thus include copper (Cu). However, an example embodiment thereof is not limited thereto, and may include a metal material such as copper (Cu), aluminum (Al), silver (Ag), tin (Sn), gold (Au), nickel (Ni), lead (Pb), titanium (Ti), or alloys thereof. The stopper layer 115 may be patterned by a TT, and may have a profile in which a side surface is tapered. The stopper layer 115 may be configured as a copper foil of a CCL without performing an additional plating process, and a thickness t1 of the stopper layer 115 may be less than a thickness t2 of the first wiring layer 112a. The thickness t1 of the stopper layer 115 may also be less than a thickness of the second wiring layer 112b.

The electronic component 120 may be disposed in a recess 110H. A wall of the electronic component 120 may be attached to the stopper layer 115 through an adhesive such as a die attach film (DAF). The electronic component 120 may be configured as an IC in which several hundreds to several millions or more of devices are integrated in a single chip. For example, the electronic component 120 may be implemented by a processor chip such as a central processing unit (CPU), a graphics processor (GPU), a field programmable gate array (FPGA), an application processor (AP), a digital signal processor, a cryptographic processor, a microprocessor, a microcontroller, and the like, an application processor (AP), for example, but an example embodiment thereof is not limited thereto. The electronic component 120 may also be implemented by a memory such as a volatile memory (e.g., a DRAM), a non-volatile memory (e.g., a ROM and a flash memory), or the like, or a logic such as an application-specific IC (ASIC), or the like. The electronic component 120 may also be configured as a chip-type passive component.

The electronic component 120 may be formed based on an active wafer. As a base material of a body of the electronic component 120, silicon (Si), germanium (Ge), gallium arsenide (GaAs), or the like, may be used. Various circuits may be disposed in the body. A connection pad 120P may be disposed on an active surface of the body. The connection pad 120P may be configured to electrically connect the electronic component 120 to the other elements, and as a material of the electronic component 120, a conductive material such as copper (Cu), aluminum (Al), or the like, may be used. A passivation film for covering at least a portion of the connection pad 120P and exposing at least a portion of the connection pad 120P may be disposed on an active surface of the body. The passivation film may be configured as an oxide film or a nitride film, or may be configured as a dual layer including an oxide film and a nitride film. An insulating film, and the like, may further be disposed at a desired position. The electronic component 120 may be configured as a bare die, but an example embodiment thereof is not limited thereto. The electronic component 120 may also be configured as a packaged die.

The insulating material 130 may be laminated on the core substrate 110 and the electronic component 120, and accordingly, the insulating material 130 may cover at least a portion of each of the core substrate 110 and the electronic component 120. The insulating material 130 may also fill at least a portion of each of the cavity 110H and the groove G. As the stopper layer 115 is configured to protrude, rather than being embedded, the insulating material 130 may cover at least a portion of a side surface of the stopper layer 115. A material of the insulating material 130 may not be limited to any particular material. For example, an insulating material may be used, and as the insulating material, a thermosetting resin such as an epoxy resin, a thermoplastic resin such as a polyimide resin, an insulating material in which the thermosetting resin or the thermoplastic resin is mixed with an inorganic filler or is impregnated in a core material with an inorganic filler and/or a glass fiber (or a glass cloth or a glass fabric), such as prepreg, Ajinomoto build-up film (ABF), FR-4, bismaleimide triazine (BT), or the like, may be used, for example. If desired, a photoimageable encapsulant (PIE) resin may be used as the insulating material 130.

The third wiring layer 132 may be disposed on an upper surface of the insulating material 130. The third wiring layer 132 may include a metal material such as copper (Cu), aluminum (Al), silver (Ag), tin (Sn), gold (Au), nickel (Ni), lead (Pb), titanium (Ti), or alloys thereof. The third wiring layer 132 may perform various functions in example embodiments. For example, the third wiring layer 132 may include a ground (GND) pattern, a power (PWR) pattern, a signal (S) pattern, and the like. The signal (S) pattern may include various signals other than a ground (GND) pattern, a power (PWR) pattern, and the like, a data signal, and the like, for example. Each pattern may have a line shape, a plane shape, or a pad shape. The third wiring layer 132 may be formed through a process such as an AP, a SAP, a MSAP, a TT, or the like, and accordingly, the third wiring layer 132 may include a seed layer, which is an electroless plating layer, and an electrolytic plating layer formed based on the seed layer.

A connection via 133 may connect the third wiring layer 132 to the connection pad 120P of the electronic component 120 and/or the second wiring layer 112b of the core substrate 110. By the connection via 133, an electrical connection path may be provided between the third wiring layer 132 and the connection pad 120P of the electronic component 120 and/or the second wiring layer 112b. The connection via 133 may include a metal material such as copper (Cu), aluminum (Al), silver (Ag), tin (Sn), gold (Au), nickel (Ni), lead (Pb), titanium (Ti), or alloys thereof. The connection via 133 may include a via used for a signal, a via used for ground, a via used for power, and the like, in example embodiments. The connection via 133 may be completely filled with a metal material, or a metal material may be formed along a wall of a via hole. A wall of the connection via 133 may have a tapered profile. The connection via 133 may also be formed by a plating process, such as an AP, a SAP, a MSAP, a TT, or the like, and accordingly, the connection via 133 may include a seed layer, which is an electroless plating layer, and an electrolytic plating layer formed based on the seed layer. The connection via 133 may be integrated with at least a portion of the third wiring layer 132 without boundaries.

The first passivation layer 140 may be an additional element, and may protect the first wiring layer 112a from external physical and chemical damages. The first passivation layer 140 may be disposed on a lower surface of the first insulating layer 111a and may cover at least a portion of the first wiring layer 112a, and may have a plurality of first openings for exposing each portion of the first wiring layer 112a. A material of the first passivation layer 140 may not be limited to any particular material. For example, an insulating material may be used, and as an insulating material, a thermosetting resin such as an epoxy resin, a thermoplastic resin such as a polyimide resin, an insulating material in which the thermosetting resin or the thermoplastic resin is mixed with an inorganic filler or is impregnated in a core material with inorganic filler with a glass fiber, such as prepreg, ajinomoto build-up film (ABF), FR-4, bismaleimide triazine (BT), or the like, may be used, for example. Alternatively, a solder resist (SR) may be used.

The second passivation layer 150 may be an additional element, and may protect the third wiring layer 132 from external physical and chemical damages. The second passivation layer 150 may be disposed on an upper surface of the insulating material 130 and may cover at least a portion of the third wiring layer 132, and may have a plurality of second openings for exposing each portion of the third wiring layer 132. A material of the second passivation layer 150 may not be limited to any particular material. For example, an insulating material may be used, and as an insulating material, a thermosetting resin such as an epoxy resin, a thermoplastic resin such as a polyimide resin, an insulating material in which the thermosetting resin or the thermoplastic resin is mixed with an inorganic filler or is impregnated in a core material with an inorganic filler with a glass fiber, such as prepreg, Ajinomoto build-up film (ABF), FR-4, bismaleimide triazine (BT), or the like, may be used, for example. Alternatively, a solder resist (SR) may be used.

The electrical connector metal 160 may physically and/or electrically connect the substrate having an electronic component embedded therein 100 to an external entity. For example, the substrate having an electronic component embedded therein 100 may be mounted on a mainboard of an electronic device, a ball grid array (BGA), or the like, through the electrical connector metal 160. The electrical connector metal 160 may be formed of tin (Sn), or an alloy including tin (Sn), such as a solder, for example, but an example embodiment thereof is not limited thereto. The electrical connector metal 160 may be configured as a land, a ball, a pin, or the like. The electrical connector metal 160 may include multiple layers, or a single layer. When the electrical connector metal 160 includes multiple layers, the electrical connector metal 160 may include copper pillar or solder, and when the electrical connector metal 160 includes a single layer, the electrical connector metal 160 may include tin-silver solder or copper. However, an example embodiment thereof is not limited thereto. The number of the electrical connector metal 160, a gap between the electrical connector metals 160, and an arrangement form of the electrical connector metal 160 may not be limited to any particular examples, and may be varied in example embodiments.

Components 210, 220, and 230 may be disposed on the second passivation layer 150. The components 210, 220, and 230 may be surface-mounted on the second passivation layer 150 through connection members 215, 225, and 235, respectively. The components 210, 220, and 230 may be configured as active components and/or passive components. An example of active components may include a chip-type capacitor such as a multilayer ceramic capacitor (MLCC), a chip-type inductor such as a power inductor (PI), and the like. The connection members 215, 225, and 235 may include tin (Sn) or an alloy including tin (Sn), such as a solder, or the like, for example. As the components 210, 220, and 230 are disposed, the substrate having an electronic component embedded therein 100 may be used as an SiP.

The substrate having an electronic component embedded therein 100 may include a plurality of the cavities 110H, and the stopper layer 115 and the groove G described above may be applied to the cavities 110H. The same or different electronic components may be disposed in the cavities 110H, respectively. Also, a built-up insulating layer may be disposed on an upper side of the insulating material 130 of the substrate having an electronic component embedded therein 100, and more number of wiring layers and connection via layers may be disposed through the built-up insulating layer. Also, in the substrate having an electronic component embedded therein 100, the built-up insulating layer may also be disposed on a lower side of the core substrate 110, and a greater number of wiring layers and connection via layers may be disposed through the built-up insulating layer.

FIGS. 6 to 8 are diagrams illustrating an example of a process for manufacturing a substrate having an electronic component embedded therein illustrated in FIG. 3.

Referring to FIG. 6, a CCL may be prepared. In a CCL, a copper foil M1 may be disposed on both surfaces of a first insulating layer 111a, and a carrier copper foil M2 may be disposed on the copper foil M1 through a release layer. The copper foil M1 and the carrier copper foil M2 may be patterned using a TT, or the like, thereby forming a stopper layer 115. The carrier copper foil M2 disposed on a lower portion may be physically removed through a peeling process using the release layer. An RCC on which a copper foil M3 is disposed, or the like, may be laminated on one surface of the first insulating layer 111a, such as prepreg, thereby forming the second insulating layer 111b on the first insulating layer 111a. A via hole for forming a through-via 113 may be formed using a laser drill, a mechanical drill, or the like, and the first and second wiring layers 112a and 112b and the through-via 113 may be formed through a generally used plating process using the copper foils M1 and M3.

Referring to FIG. 7, a laser process for forming the cavity 110H may be performed while the carrier copper foil M2 on the stopper layer 115 is not removed. The carrier copper foil M2 may be used as a stopper, and the laser process may be performed only along an edge of the stopper. A portion of a laser beam may be blocked by a stopper, and the other portion of the beam may process the first and second insulating layers 111a and 111b. By the cavity 110H process, a groove G extending from the cavity 110 and penetrating a portion of the first insulating layer 111a may be formed. The carrier copper foil M2 and the second insulating layer 111b remaining on the carrier copper foil M2 may be physically removed through a release peeling process. An electronic component 120 may be attached to the stopper layer 115 in the cavity 110H using an adhesive 125 and the electronic component 120 may be disposed to be faced up. Prepreg, an ABF, or the like, may be laminated on the core substrate 110 and the electronic component 120, thereby forming an insulating material 130.

Referring to FIG. 8, a via hole for forming the connection via 133 may be formed in the insulating material 130 through a laser process, and the third wiring layer 132 and the connection via 133 may be formed using a plating process. Prepreg or an ABF may be laminated on both sides, thereby forming first and second passivation layers 140 and 150. Openings may be formed in the first and second passivation layers 140 and 150. An electrical connector metal 160 may be formed. If desired, components 210, 220, and 230 may be mounted through connection members 215, 225, and 235. The substrate having an electronic component embedded therein 100 in the example embodiment may be manufactured through the above-described processes.

According to the aforementioned example embodiments, a substrate having an electronic component embedded therein which may improve productivity of a cavity process for mounting an electronic component may be provided.

Also, a substrate having an electronic component embedded therein which may be modulated in a form of a SiP and may have a reduced size may be provided.

In the example embodiments, the terms "side region," "side surface," and the like, may be used to refer to a surface formed taken in right/left directions, the terms "lower side," "lower portion," "lower surface," and the like, may be used to refer to directions facing downwardly with reference to a cross-section in the diagrams for ease of description, and the terms "upper side," "upper portion," "upper surfaces," and the like, may be used to refer to directions opposing the above directions. The notion that an element is disposed on a side region, an upper side, an upper region, or a lower resin may include the configuration in which the element is directly in contact with an element configured as a reference in respective directions, and the configuration in which the element is not directly in contact with the reference element. The terms may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

The terms used in the example embodiments are used to simply describe an example embodiment, and are not intended to limit the present disclosure. A singular term includes a plural form unless otherwise indicated.

While the example embodiments have been shown and described above, it will be apparent to those skilled in the art that modifications and variations could be made without departing from the scope of the present invention as defined by the appended claims.

What is claimed is:

1. A substrate having an electronic component embedded therein, comprising:
a core substrate including first and second wiring layers disposed on different levels in a first direction and one or more insulating layers disposed between the first and second wiring layers in the first direction, the one or more insulating layers having a cavity in which a stopper layer is disposed on a surface of a first insulating layer of the one or more insulating layers, and including a groove disposed around the stopper layer on the surface;
an electronic component disposed on the stopper layer in the cavity; and
an insulating material covering at least a portion of each of the core substrate and the electronic component and disposed in at least a portion of each of the cavity and the groove,
wherein the stopper layer protrudes on the surface,
wherein the first and second wiring layers are connected to each other through a through-via,
wherein the through-via overlaps the stopper layer in a second direction perpendicular to the first direction,
wherein an entirety of a surface of the first insulating layer outside of, and coplanar with, the surface of the first insulating layer on which the stopper layer is disposed, is devoid of a wiring layer being disposed directly thereon, and
wherein the groove extends in a portion of the first insulating layer.

2. The substrate of claim 1,
wherein the one or more insulating layers further includes a second insulating layer disposed on the first insulating layer.

3. The substrate of claim 2, wherein at least a portion of a side surface of the stopper layer is covered with the insulating material.

4. The substrate of claim 2,
wherein the cavity penetrates through the second insulating layer from a surface of the second insulating layer opposing a surface of the second insulating layer connected to the first insulating layer, towards the surface of the second insulating layer connected to the first insulating layer.

5. The substrate of claim 2, wherein the first wiring layer is disposed on another surface of the first insulating layer, the second wiring layer is disposed on a surface of the second insulating layer opposing a surface of the second insulating layer connected to the first insulating layer, and the first and second wiring layers are connected to each other through the through-via penetrating the first and second insulating layers.

6. The substrate of claim 5, wherein the stopper layer is disposed on a level between the first and second wiring layers.

7. The substrate of claim 1, wherein the stopper layer has a thickness less than a thickness of each of the first and second wiring layers.

8. The substrate of claim 7, wherein the stopper layer is disposed only in a region surrounded by the cavity.

9. The substrate of claim 1, wherein a side surface of the stopper layer has a tapered profile.

10. The substrate of claim 1, wherein the electronic component has a first surface on which a connection pad is disposed and a second surface opposing the first surface, and is disposed in the cavity such that the second surface faces the stopper layer.

11. The substrate of claim 10, further comprising an adhesive disposed between the second surface of the electronic component and the stopper layer to attach the second surface of the electronic component to the stopper layer.

12. The substrate of claim 1, further comprising a third wiring layer disposed on the insulating material.

13. The substrate of claim 12, wherein the third wiring layer is connected to the second wiring layer and a connection pad of the electronic component through a connection via penetrating the insulating material.

14. The substrate of claim 12, further comprising:
a first passivation layer disposed on a side opposing a side of the core substrate on which the insulating material is disposed, and having a first opening for exposing a portion of the first wiring layer; and
a second passivation layer disposed on a side opposing a side of the insulating material on which the core substrate is disposed, and having a second opening for exposing a portion of the third wiring layer.

15. The substrate of claim 14, further comprising:
an electrical connector metal disposed on the first opening and connected to a portion of the exposed first wiring layer.

16. The substrate of claim 14, further comprising:
a component disposed on the second passivation layer and connected to a portion of the exposed third wiring layer, wherein the component includes at least one of an active component or a passive component.

17. The substrate of claim 1, wherein the stopper layer is composed of a metal.

18. A substrate having an electronic component embedded therein, comprising:
a core substrate including a first insulating layer, a second insulating layer disposed on an upper surface of the first insulating layer, a first wiring layer disposed on a lower surface of the first insulating layer, and a second wiring layer disposed on an upper surface of the second insulating layer, having a cavity penetrating the second insulating layer and having an uppermost surface of the first insulating layer as a bottom surface of the cavity and a groove extending in a portion of the first insulating layer disposed around the bottom surface, and having a stopper layer disposed on the bottom surface;
an electronic component disposed on the stopper layer in the cavity;
an insulating material laminated on the core substrate and the electronic component; and
a third wiring layer disposed on the insulating material,
wherein the stopper layer is disposed between the first and second wiring layers, and
wherein an entirety of the uppermost surface of the first insulating layer outside of, and coplanar with, the bottom surface of the cavity is devoid of a wiring layer being disposed directly thereon.

19. The substrate of claim 18,
wherein the cavity has first and second walls having first and second slopes, respectively,
wherein the groove extends from the first wall of the cavity, and
wherein a slope of the first wall is less than a slope of the second wall.

20. The substrate of claim 18, wherein the stopper layer is composed of a metal.

* * * * *